United States Patent [19]

Williams

[11] Patent Number: 4,850,893

[45] Date of Patent: Jul. 25, 1989

[54] TEST PROBE APPARATUS

[76] Inventor: Robert A. Williams, 2721 White Settlement Rd., Fort Worth, Tex. 76107

[21] Appl. No.: 104,813

[22] Filed: Oct. 1, 1987

Related U.S. Application Data

[63] Continuation-in-part of Ser. No. 50,091, May 14, 1987, abandoned.

[51] Int. Cl.$^4$ ......................................... H01R 13/631
[52] U.S. Cl. ................................................... 439/349
[58] Field of Search .................. 439/345, 347–349; 285/82, 84–86, 314–316, 318

[56] References Cited

U.S. PATENT DOCUMENTS

| | | | |
|---|---|---|---|
| Re. 28,328 | 2/1975 | Williams | 339/91 |
| 2,939,728 | 6/1960 | Bitel | 285/315 |
| 2,983,978 | 5/1961 | Wilgus | 439/345 |
| 3,312,928 | 4/1967 | Nava et al. | 439/349 |
| 3,505,635 | 4/1970 | Williams | 339/91 |
| 3,609,637 | 9/1971 | Cole | 439/349 |
| 4,174,146 | 11/1979 | Williams | 339/143 R |
| 4,355,854 | 10/1982 | Williams | 339/89 R |
| 4,364,624 | 12/1982 | Williams | 339/154 R |
| 4,422,704 | 12/1983 | Williams | 339/91 R |
| 4,525,016 | 6/1985 | Williams | 339/75 R |
| 4,602,123 | 7/1986 | Williams | 174/72 R |

FOREIGN PATENT DOCUMENTS 683011 3/1964 Canada .............................. 285/318

Primary Examiner—Joseph H. McGlynn
Attorney, Agent, or Firm—Arthur F. Zobal

[57] ABSTRACT

The test probe is formed by a tubular body member carrying electrical contacts at its front end. An annular slot is formed in the outer portion of the test probe with an elastic ring shaped member located therein. A moveable sleeve is located around the tubular body member for forward and rearward movement relative to the tubular body member. The sleeve has a plurality of angularly spaced apart arms at its front end. In the forward position of the sleeve, the arms are located in the annular slot forcing at least portions of the elastic ring shaped member outward for latching purposes. In the rearward position of the sleeve, its arms are moved rearward of the ring shaped member sufficient to allow it to be released inwardly into the annular slot to an unlatching position. In one embodiment, grooves are formed in the outer surfaces of the arms for receiving the ring shaped member when the sleeve is located in its forward position for releasably holding the sleeve in its forward position. In another embodiment, the arms have no grooves and a second elastic ring shaped member is employed at the rear of the test probe for releaseably holding the sleeve in its forward position. In still another embodiment, the forward wall of the annular slot is formed by an inclined surface. The forward edge of the sleeve engages and forces the ring shaped member in the annular slot forward and outward against the inclined surface for latching purposes.

43 Claims, 13 Drawing Sheets

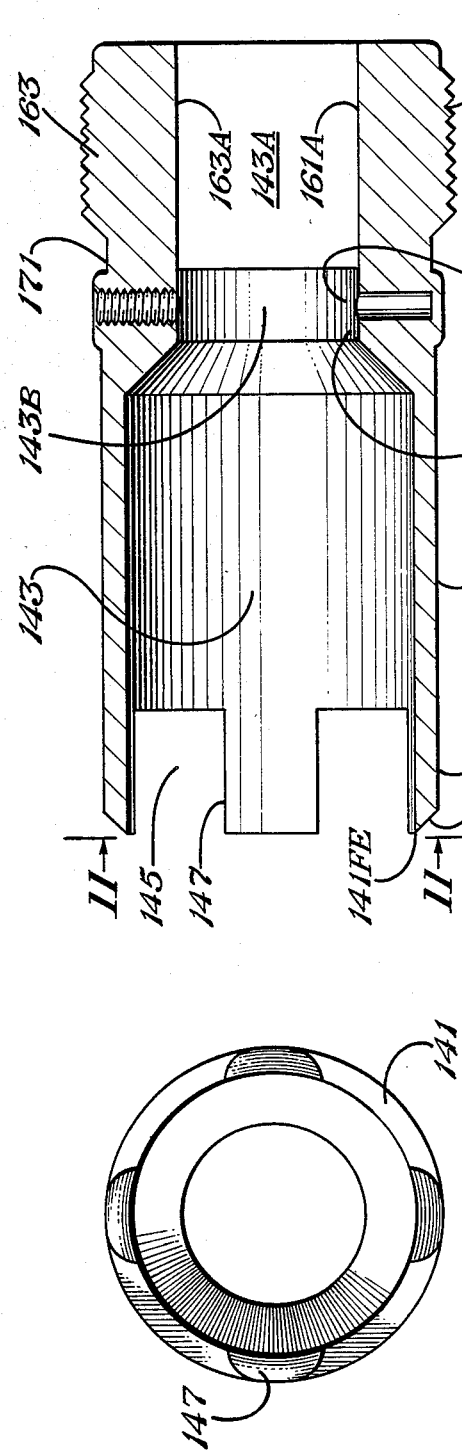
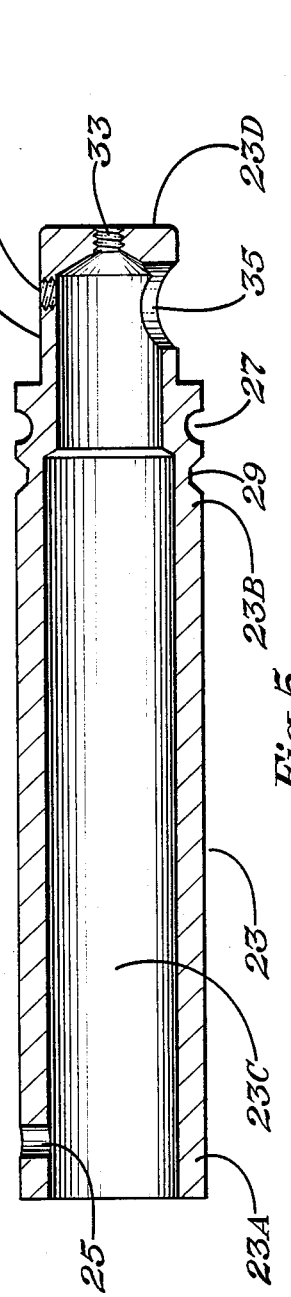
Fig.10
Fig.11
Fig.5

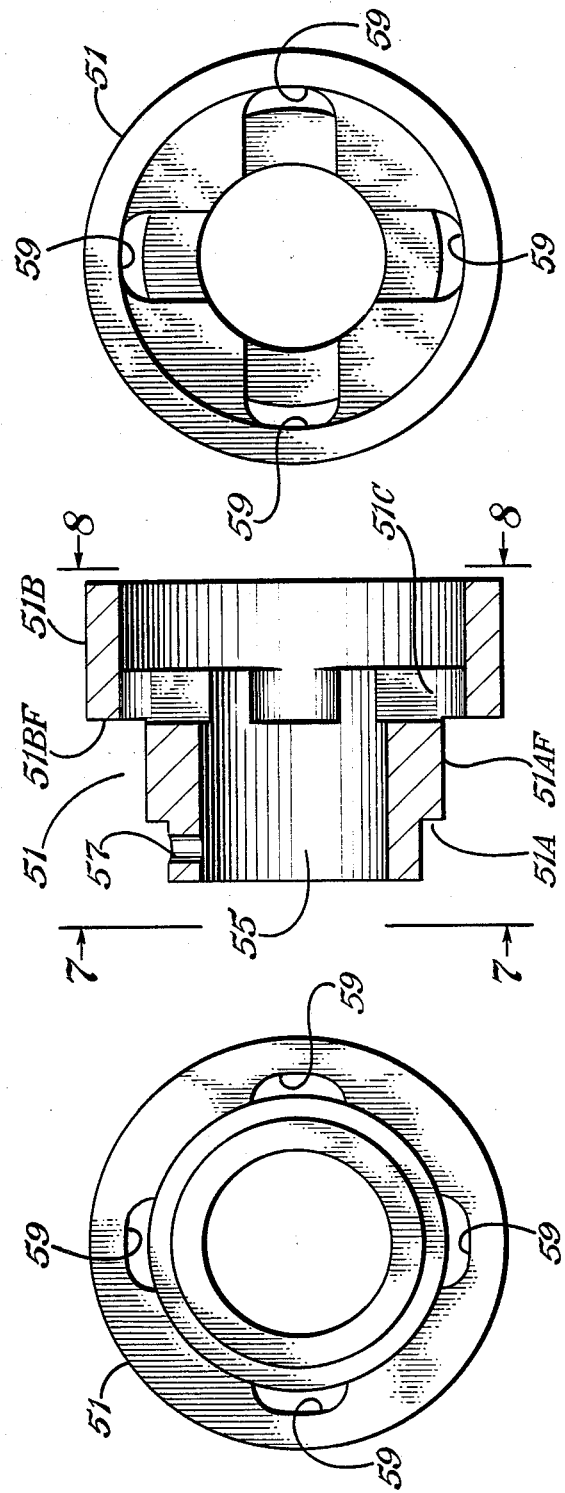

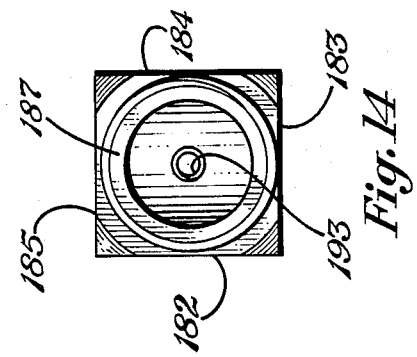
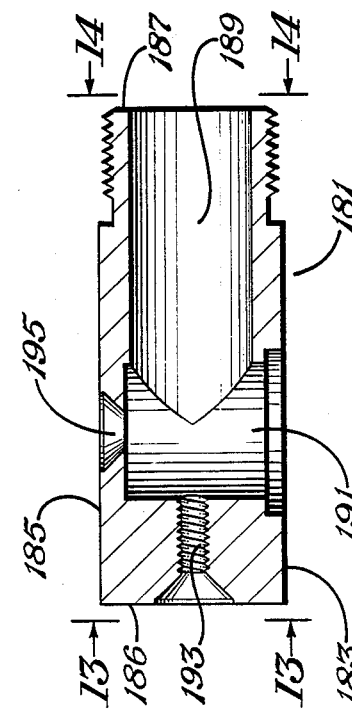
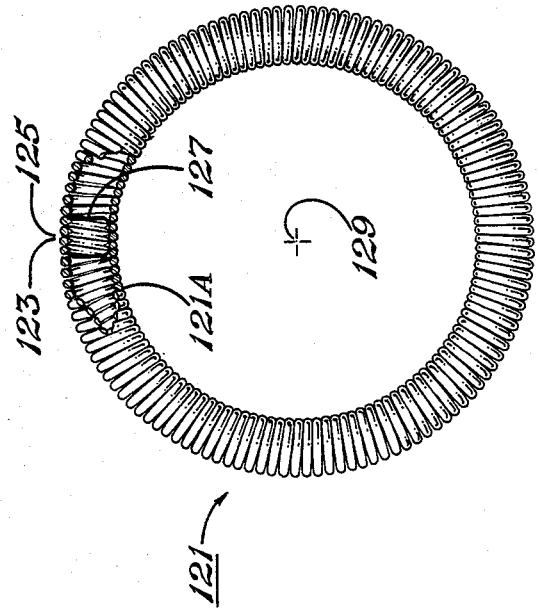
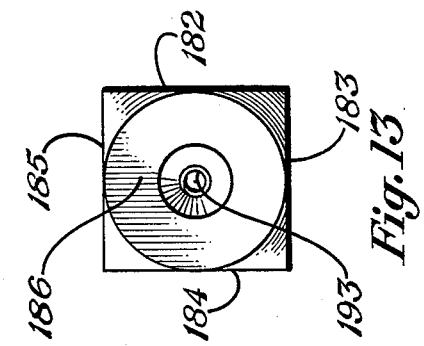

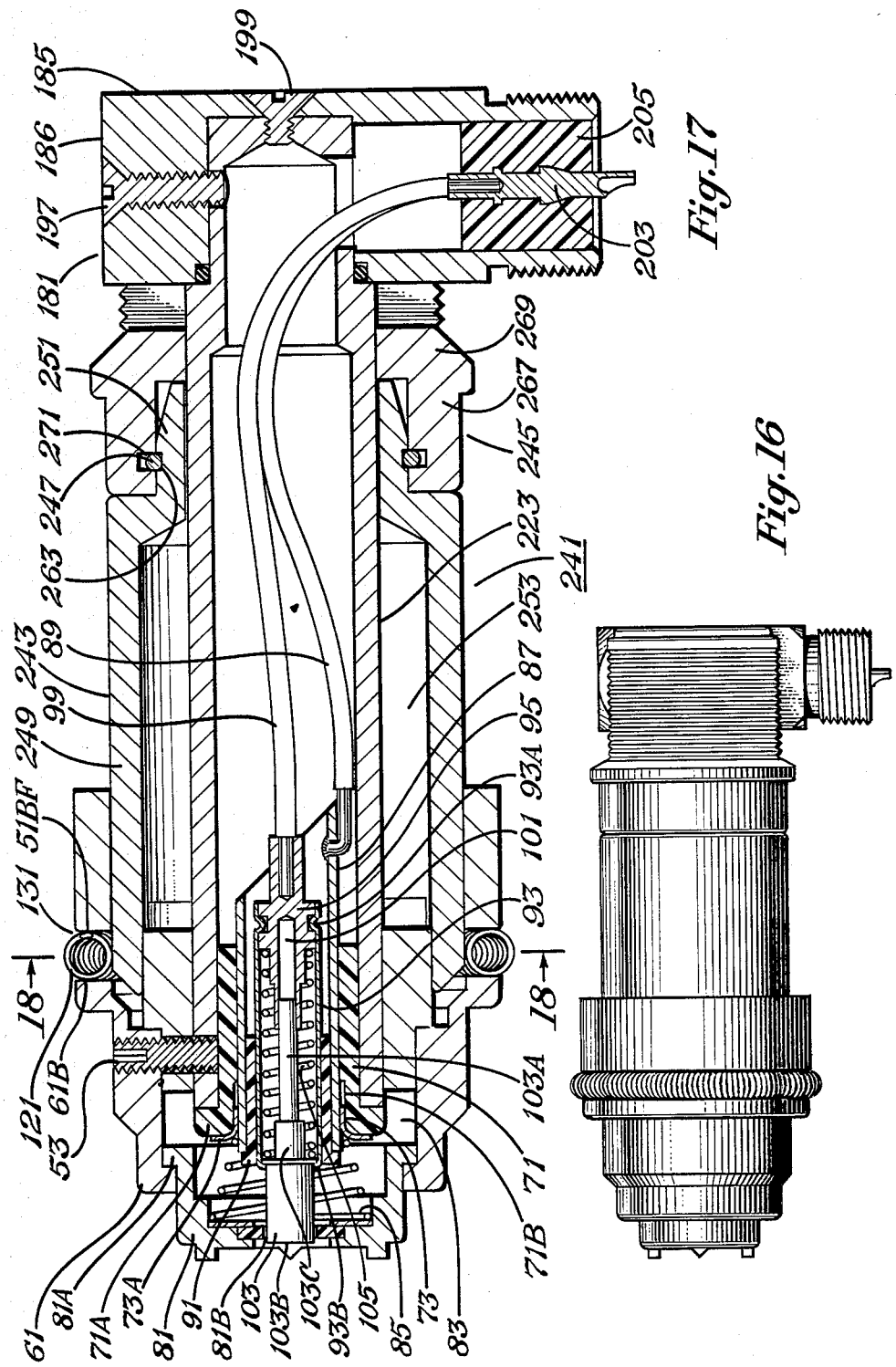

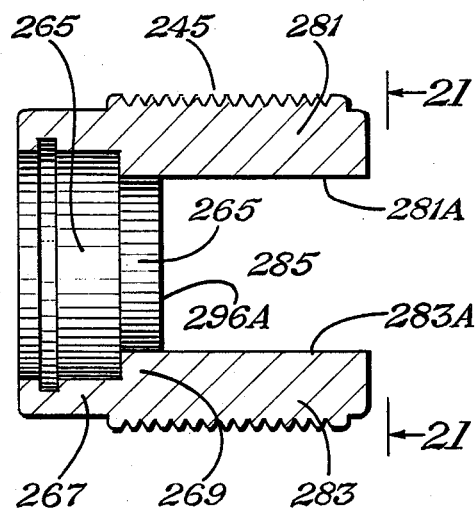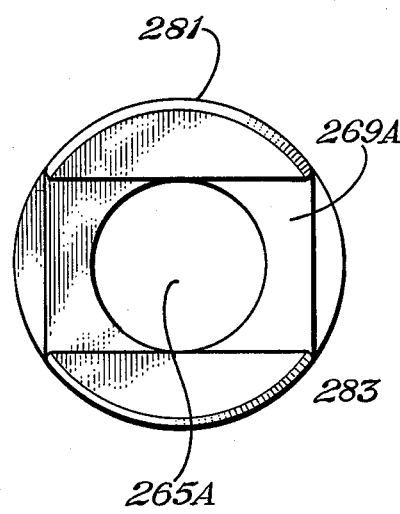
Fig.20  Fig.21
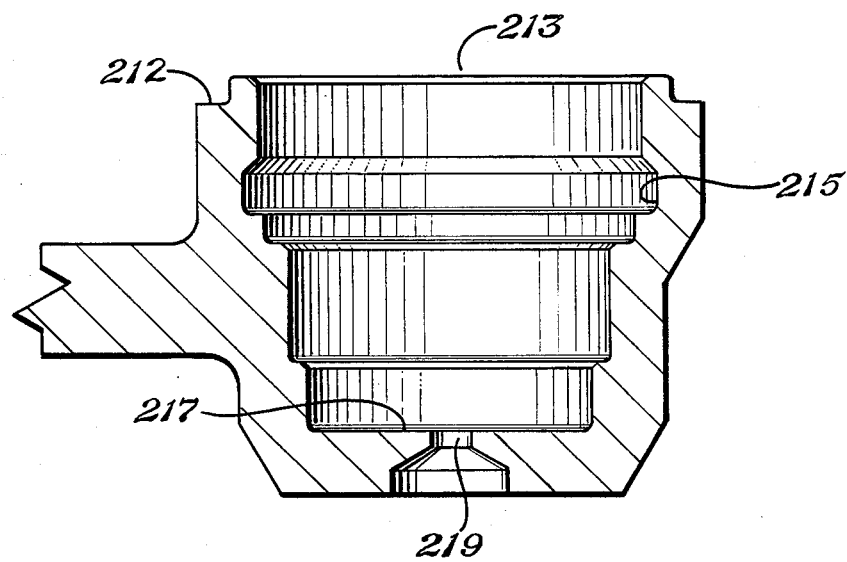
Fig.22

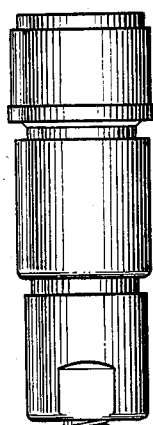
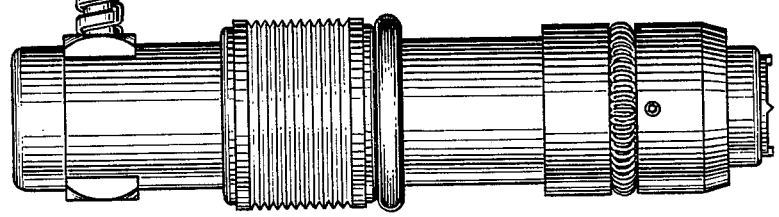
Fig. 23
Fig. 24

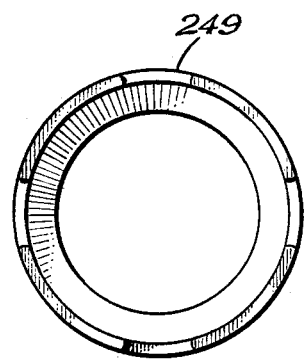
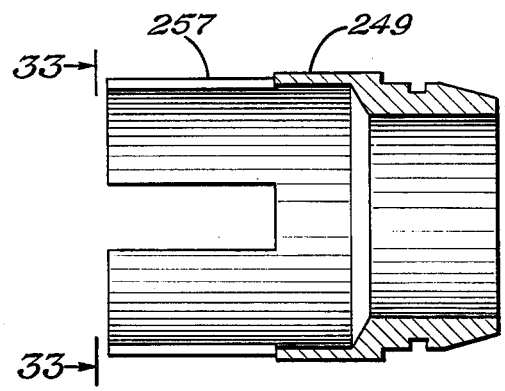
Fig.33　　　Fig.32
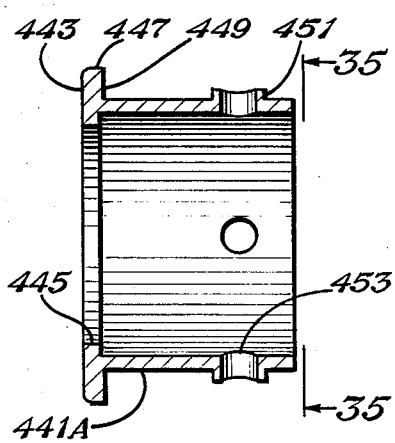
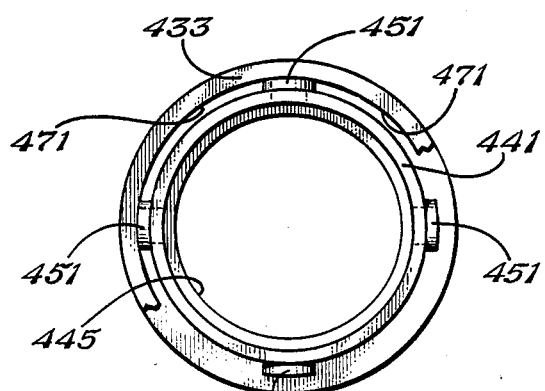
Fig.34　　　Fig.35
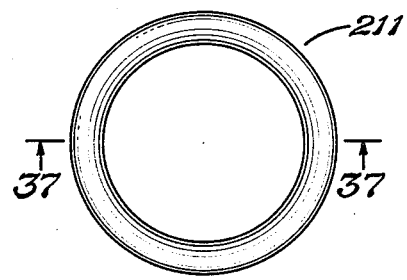
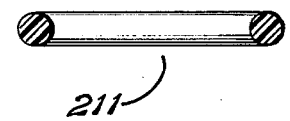
Fig.36　　　Fig.37

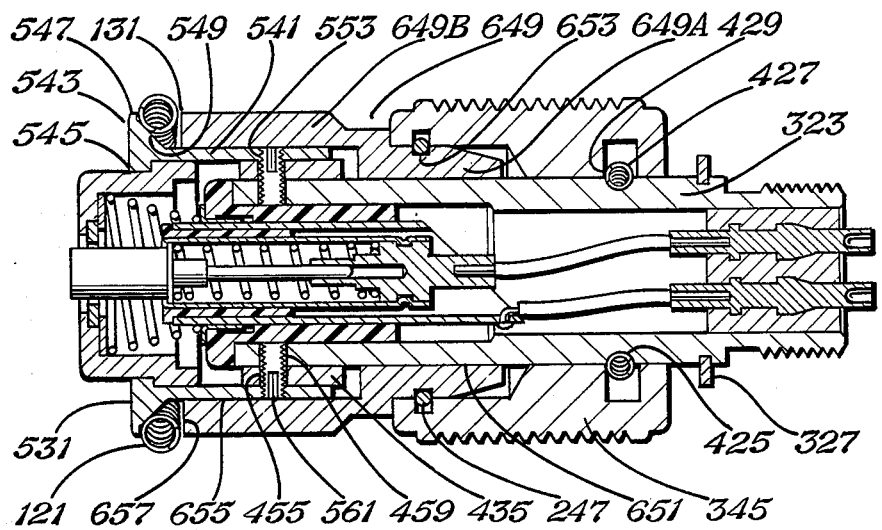
Fig. 38
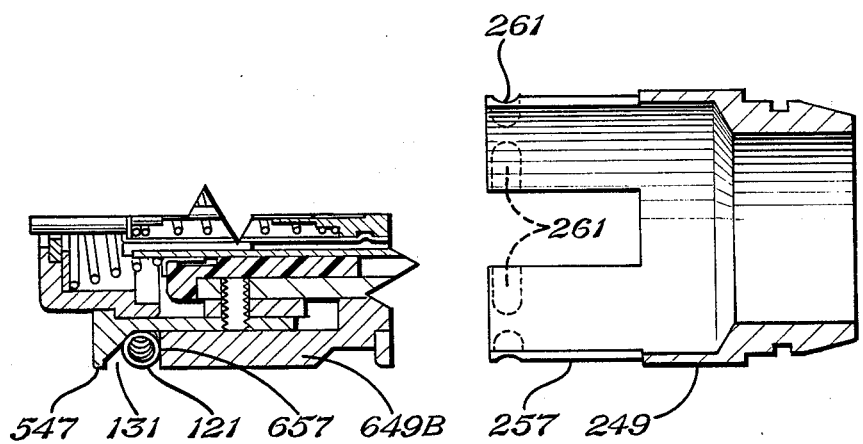
Fig. 39
Fig. 40

TEST PROBE APPARATUS

This application is a continuation-in-part of U.S. patent application Ser. No. 07/050,091, filed on May 14, 1987 and now abandoned entitled "Test Probe".

BACKGROUND OF THE INVENTION

1. Field of the Invention

The invention relates to a latching apparatus for a test probe and also an apparatus in a test probe for routing electrical wires.

2. Description of the Prior Art

Ball and finger type latching mechanisms for latching a test probe in an opening of a device to be tested are well known, for example as disclosed in U.S. Pat. Nos. Re. 28,328 and 3,505,635. Although very useful, these latching mechanisms sometimes come out of the test probe apparatus whereby the test probe apparatus has to be disassembled to correct the problem. Springs have been employed in devices for locking or latching purposes, as shown in U.S. Pat. Nos. 4,355,854 and 4,422,704. U.S. Pat. Nos. 4,174,146, 4,364,624, 4,525,016, and 4,602,123 disclose different types of devices for routing electrical leads.

SUMMARY OF THE INVENTION

It is an object of the invention to provide a test probe apparatus having a unique latching mechanism for latching the test probe in an opening of a device to be tested which is easy to replace and which can latch the test probe in openings of different sizes.

It is another object of the invention to provide a test probe apparatus having a unique structural arrangement for routing electrical wires.

The test probe apparatus comprises a tubular body means carrying electrical contact means at its front end. The latching apparatus comprises an annular slot formed in the outer portion of the test probe structure with an elastic ring shaped member located therein and a moveable sleeve means located around the tubular body means. The sleeve means is adapted to be moved forward relative to said tubular body means to move front means thereof into engagement with the ring shaped member for moving at least portions of the shaped member outward of the annular slot for latching purposes. The sleeve means is adapted to be moved rearward relative to said tubular body means to move its front means rearward of the ring shaped member sufficient to allow it to be released inwardly into the annular slot to an unlatching position.

Preferably the elastic ring shaped member comprises a helically wound spring member having two ends connected together forming a toroidal shaped spring although it could be a non-metallic elastic ring shaped member.

In one embodiment, the annular slot is defined by forward and rearward facing wall means and inner wall means facing outwardly. At least a portion of said forward facing wall means is spaced radially outward from said inner wall means defining opening means leading to said annular slot between said forward facing wall means and said inner wall means. In the forward position of said sleeve means, said front means of said sleeve means is located between said inner wall means and said ring shaped member forcing at least portions of said ring shaped member outward for latching purposes. In this embodiment, preferably said front means of said sleeve means comprises a plurality of angularly spaced apart arm members.

In another embodiment, the outer surface of said front means of said sleeve means comprises groove means formed therein. In the forward position of said sleeve means, said front means of said sleeve means is located between said inner wall means and said ring shaped member, forcing at least portions of said ring shaped member outward into said groove means of said front means of said sleeve means for releaseably holding said sleeve means in its forward position and for latching purposes. In this embodiment, preferably said front means of said sleeve means comprises a plurality of angularly spaced apart arm members with said groove means formed in the outer surfaces of said arm members.

In another embodiment, structure coupled to the front portion of said tubular body means forms at least a portion of the annular slot and comprises an inclined surface which extends outward away from said front portion of said tubular body means. Said front means of said sleeve means comprises an end wall forming another portion of the annular slot which engages and forces said ring shaped member outward against said inclined surface when said sleeve means is moved toward said forward position for moving said ring shaped member outward of the annular slot for latching purposes.

In a further embodiment, an annular rear slot is formed in the outer wall of the tubular body means and an annular rear slot is formed in the inner wall of said sleeve means. The two annular rear slots are in alignment with each other when said sleeve means is in its forward position relative to said tubular body means and out of alignment with each other when said sleeve means is in its rearward position relative to said tubular body means. A second elastic ring shaped ember is provided. The annular rear slot formed in the inner wall of said sleeve means has a size sufficient to completely receive the second ring shaped member and the annular rear slot formed in the outer wall of said tubular body means has a size sufficient to only partially receive the second ring shaped member. The second ring shaped member is located around said tubular body means rearward of said annular rear slot formed in said tubular body means and in said annular rear slot formed in said sleeve means when said sleeve means is in its rearward position and is located partially in both of said annular rear slots when said sleeve means is in its forward position for releaseably holding said sleeve means in its forward position relative to said tubular body means.

Preferably the second elastic ring shaped member comprises a helically wound spring member having two ends connected together forming a toroidal shaped spring although it could be a non-metallic elastic ring shaped member.

The structural arrangement for routing electrical wires comprises a block member having a first opening formed into its side and a second opening formed in its end with said first and second openings intersecting each other. The rear end of said tubular body means is located in said first opening and secured to said block member. Said sleeve means has a rear end which is bifurcated forming two spaced apart end members. Said block member is located in the space between said two spaced apart end members of said sleeve means such that said two end members move forward and rearward relative to said block member on opposite sides thereof as said sleeve means is moved between its forward and rearward positions. The rear end of said tubular body means has an opening formed therethrough in communication with said second opening of said block member forming a passage for said leads out of said tubular body means.

DESCRIPTION OF THE DRAWINGS

FIG. 5 is a cross-sectional view of the main support member of the test probe of FIGS. 1 and 3.

FIG. 6 is a cross-sectional side view of a stationary bushing of the test probe of FIGS. 1 and 3.

FIG. 7 is a forward end view of FIG. 6 taken along lines 7—7 thereof.

FIG. 8 is a rear end view of FIG. 6 taken along the lines 8—8 thereof.

FIG. 10 is a cross-sectional top view of the slideable sleeve of the test probe of FIGS. 1 and 3.

FIG. 11 is an end view of FIG. 10 taken along the lines 11—11 thereof.

FIG. 12 is a cross-sectional view of a rear electrical lead routing block member of the test probe of FIGS. 1 and 3.

FIG. 13 is an end view of FIG. 12 taken along the lines 13—13 thereof.

FIG. 14 is an end view of FIG. 12 taken along the lines 14—14 thereof.

FIG. 15 is a toroidal shaped coiled spring employed for the latching mechanism of the test probes of the invention.

FIG. 16 is a side view of another embodiment of the test probe of the invention.

FIG. 17 is a cross-sectional side view of the test probe of FIG. 16 with its latching spring in a latching position.

FIG. 20 is a cross-sectional view of the rear portion of the sleeve of the test probe of FIG. 17.

FIG. 21 is an end view of FIG. 20 taken along the lines 21—21 thereof.

FIG. 22 is a cross-sectional view of a housing breech into which the test probe may be inserted and latched for testing electrical components of equipment coupled to the housing breech.

FIG. 23 is a side view of another embodiment of the test probe of the invention.

FIG. 24 is a cross-sectional side view of the test probe of FIG. 23.

FIG. 32 is a cross-sectional side view of the moveable sleeve of the test probe of FIG. 29.

FIG. 33 is a front view of the sleeve of FIG. 32 taken along the lines 33—33 thereof.

FIG. 34 is a cross-sectional side view of the mount of the test probe of FIG. 29.

FIG. 35 is a rear end view of the mount of FIG. 34 taken along the lines 35—35 thereof.

FIG. 36 is an elastic non-metallic ring shaped member which may be employed in the test probes of the invention.

FIG. 37 is a cross-section of FIG. 36 taken along the lines 37—37 thereof.

FIG. 38 is a cross-sectional side view of another embodiment of the test probe of the invention.

FIG. 39 is a partial cross-sectional view of the test probe of FIG. 38 with its latching spring in an unlatched position.

FIG. 40 is modification of the sleeve component of FIG. 32.

DESCRIPTION OF THE PREFERRED EMBODIMENTS

Figure 1:
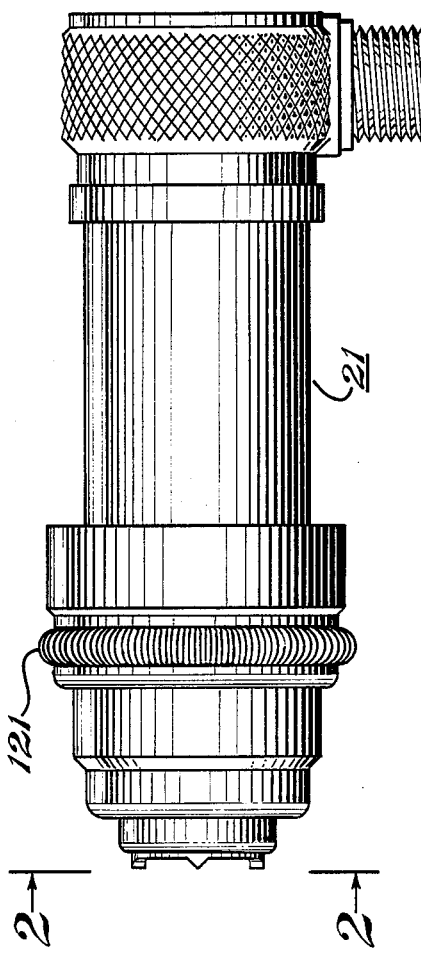
FIG. 1 is a side view of the one embodiment of test probe of the invention.
Figure 9:
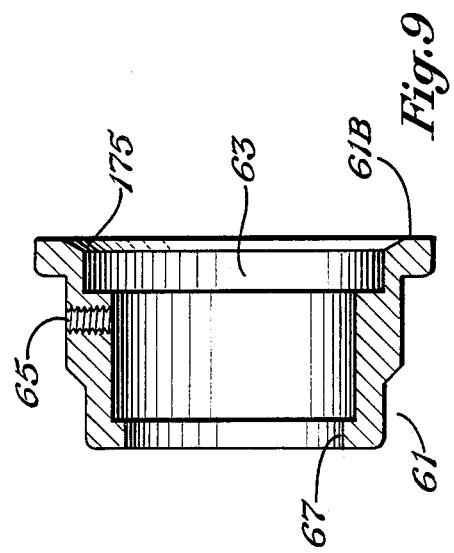
FIG. 9 is a cross-sectional view of the front shell of the test probe of FIGS. 1 and 3.
Figure 2:
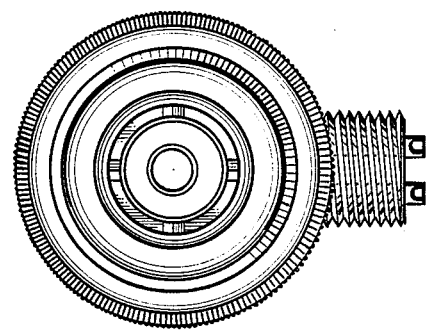
FIG. 2 is an end view of FIG. 1 as seen along the lines 2—2 thereof.

Referring to the drawings, the test probe of the embodiment of FIGS. 1-15 of the invention is identified at 21. It comprises a hollow cylindrical shaped body member 23 having a front end 23A, a rear end 23B, and a central cavity 23C. Three clearance apertures 25 (only one of which is shown) are formed through the wall of the body member 23 at its front end. The rear end 23B of the body member 23 has two annular grooves 27 and 29 formed in its outside wall. A threaded aperture 31 is formed through the side wall of member 23 at its rear end and a threaded aperture 33 is formed through its rear wall 23D. A large opening 35 also is formed through the wall of member 23 at its rear end for the passage of electrical leads.

A bushing 51 is secured around the front end 23A of the member 23 by set screws one of which is shown at 53. The bushing 51 has a front cylindrical wall 51A and a larger diameter rear cylindrical wall 51B with an axial opening 55 formed therethrough. Three clearance apertures 57 (only one of which is shown) are formed through the front wall 51A for receiving the set screws 53. The front and rear walls 51A and 51B are connected together by a radially extending wall 51C which has four openings 59 formed therethrough. The centers of adjacent openings 59 are 90° apart.

Secured around the front part of the bushing 51 and hence to the front end 23A of the body member 23 is a shell member 61 which is cylindrical in shape having an opening 63 extending axially therethrough. The side wall of the shell member has three threaded apertures 65 (only one of which is shown) formed therethrough for receiving the set screws 53. The centers of adjacent apertures 25 of body member 23 are 120° apart; the centers of adjacent apertures 57 of the bushing 51 are 120° apart; and the centers of adjacent apertures 65 of the shell 61 are 120° apart whereby the three set screws 53 secure the bushing 51 and the shell 61 to the body member 23. The set screws 53 when screwed into the apertures 65 of the shell 61 extend through the apertures 57 and 25 of the bushing 51 and of the body member 23 and bear against a tubular insert 71, holding it and the shell 61 and bushing 51 in place to the body member 23, as shown. The front end of the shell member 61 has an inward extending annular lip 67.

The hollow tubular insert 71 formed of a suitable electrically insulating plastic material is located in the front end of the cavity 23C of the member 23. The insert 71 has a radially extending flange 71A at its front end which seats against the front edge of member 23. A hollow metallic tubular member 73 is located in the front end of an enlarged diameter portion 71B at the front end of the insert 71. Member 73 has a radially extending flange 73A at its front end which seats against the front edge of the insert 71.

An annular electrical contact member 81 formed of metal, is provided at the front end of the probe 21 for forward and rearward movement. The rear portion of the contact 81 is located for rearward and forward movement in the annular space 83 between member 23 and flange 71A and shell 61. The lip 67 of the shell 61 is adapted to engage an outward extending wall 81A of the contact 81 at its rear end for limiting forward movement of the contact 81. A metallic coiled spring 85 located against the inside wall of the contact 81 and against the flange 73A of member 73 urges the contact 81 outward and provides an electrical connection between the contact 81 and member 73. Member 73 makes electrical contact with a metallic tubular member 87 located in the opening of the insert 71 to which an electrical lead 89 is connected.

Secured within the tubular member 87 is an electrical insulating sleeve 91 which engages and holds a thin metal tubular member 93. The rear end of member 93 has metallic member 95 located and secured therein by crimping the thin wall of the tubular member 93 to member 95, as shown at 93A. The rear end of member 95 is connected to an electrical lead 99 and the other end has an aperture 101 for slideably receiving the pin-like rear end 103A of a central contact 103. The forward end 103B of the contact 103 extends through a central aperture 81B of the annular contact 81 without engagement thereof. A coiled metallic spring 105 has its front end tightly located around an intermediate portion 103C of the contact 103 and its rear end engaging a forward facing wall of member 95 inside of tubular member 93. Coil 105 urges contact 103 in a forward position and provides electrical connection between contact 103 and member 95. A forward inward extending lip 93B of tubular member 93 limits forward movement of the contact 103. Leads 89 and 99 extend rearward where they are connected to terminals which extend out of the probe as will be described subsequently.

In using the test probe, its forward end is inserted into the opening or well formed in metal structure of an aircraft or other equipment such that its annular contact 81 engages the back wall of the opening and its central contact 103 is centered relative to an aperture formed through the back wall for engaging an electrical contact of circuitry of the aircraft to be tested.

The test probe of the invention has a helical coil formed in the shape of a toroid for latching the probe in the opening. The coil is illustrated at 121 and is formed by spring type metal wire helically wound to form a helical coil having two ends 123 and 125 with a central opening within the coil turns 121A which extends between the ends 123 and 125. A threaded member 127 then is screwed into the two ends 123 and 125 to bring them together to form the toroidal shaped coil 121 which can be expanded radially outward from its axis 129. When released the coil will retract radially inward toward its normal position, as shown in FIG. 15.

The coil 121 is located in the annular slot 131 formed between the rear end 61B of the shell 61 and the forward edge 51BF of the rear wall 51B of the bushing 51.

Figure 3:
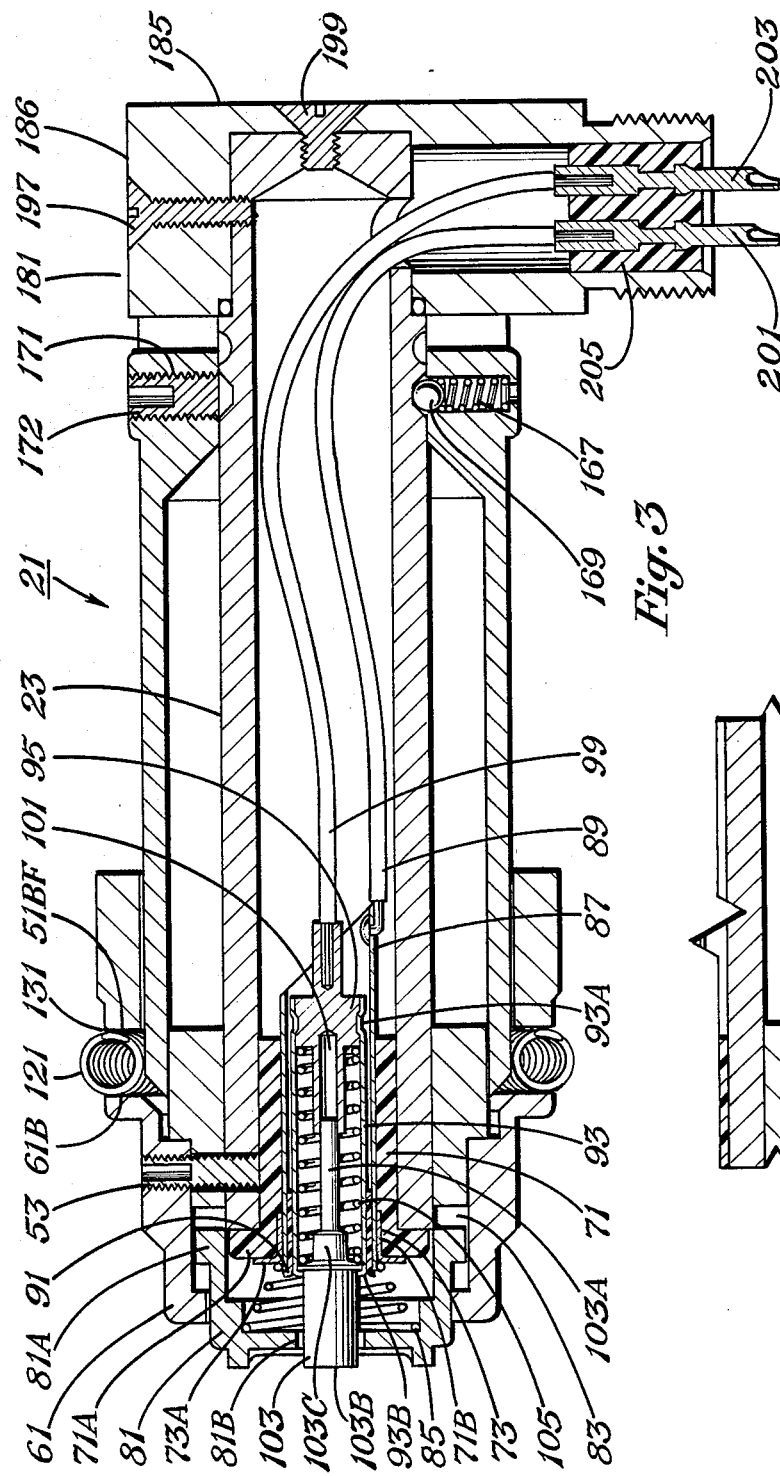
FIG. 3 is a cross-sectional side view of the test probe of FIG. 1 with its latching spring in a latching position.
Figure 4:
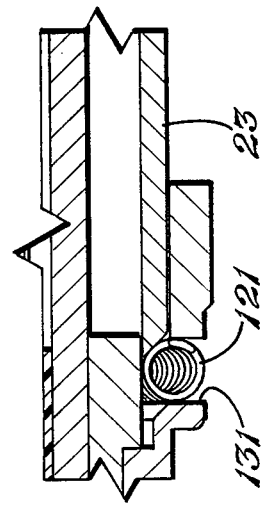
FIG. 4 is a partial cross-sectional view of the test probe of FIGS. 1 and 3 with its latching spring in an unlatched position.
Figure 19:
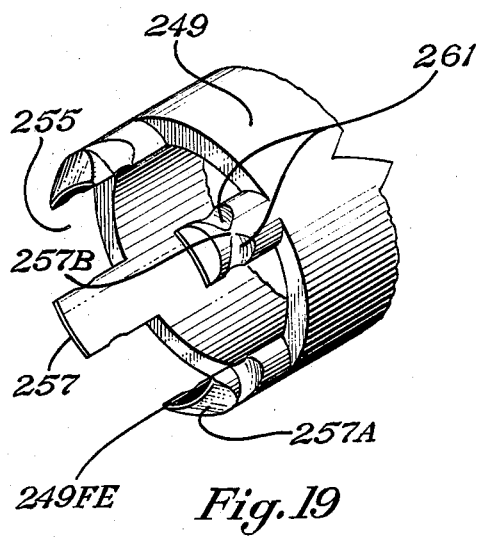
FIG. 19 is an isometric view of the front portion of the moveable sleeve of FIG. 17 showing its arms and outer grooves formed therein.
Figure 18:
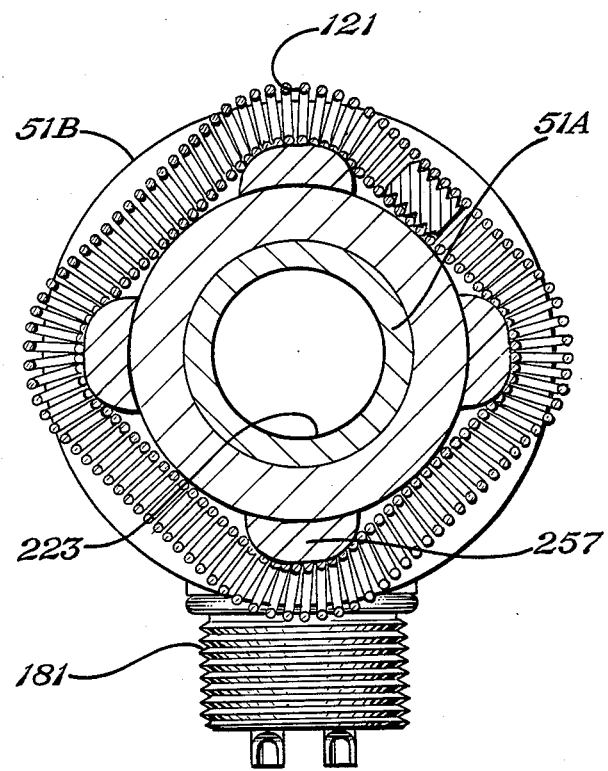
FIG. 18 is a cross-sectional view of FIG. 17 taken along the lines 18—18 with the electrical contact structure removed.
Figure 25:
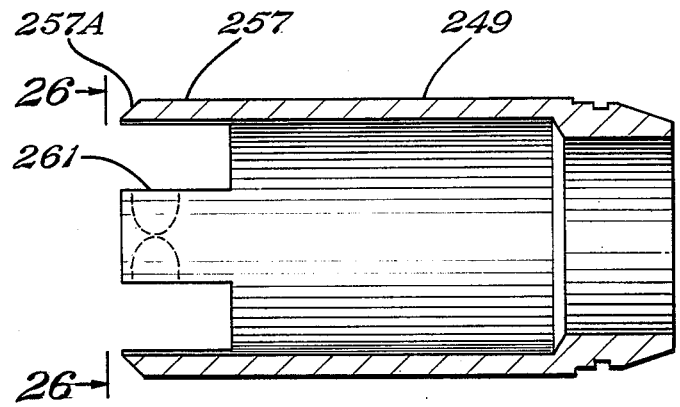
FIG. 25 is a cross-sectional side view of the sleeve of the test probe of FIG. 24.
Figure 26:
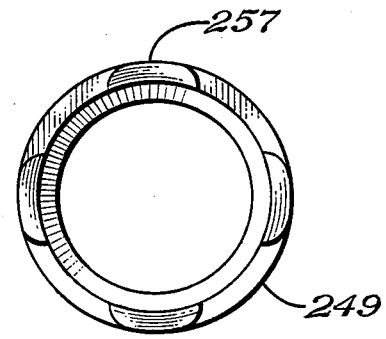
FIG. 26 is a front view of the sleeve of FIG. 25 as seen along the lines 26—26 thereof.
Figures 27, 28:
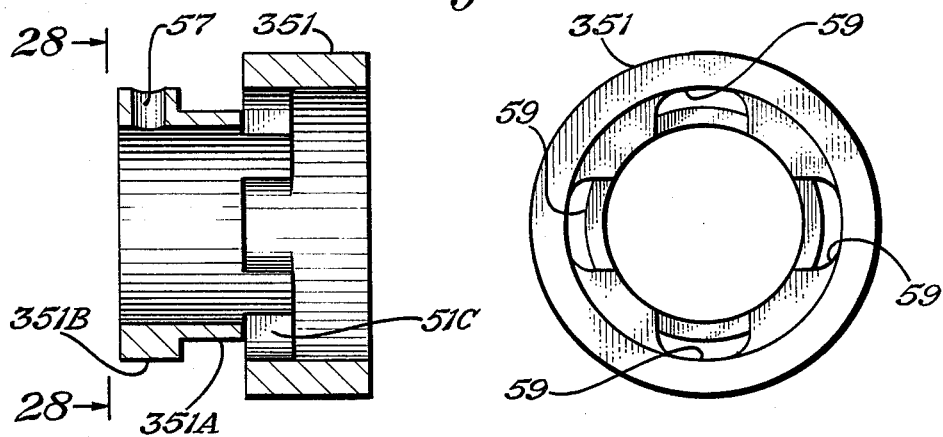
FIG. 27 is a cross-sectional side view of the bushing of the test probe of FIG. 24.
FIG. 28 is a front end view of the bushing of FIG. 27 taken along the lines 28—28 thereof.

An axially moveable sleeve 141 is employed for expanding the coil 121 radially outward to a latching position and for releasing the coil to its unlatched position in the slot 131. The sleeve 141 is generally cylindrical in shape at its forward portion 141A having an opening 143 extending axially therethrough. Its front end 141A has four spaced apart slots 145 formed rearward from its forward edge 141FE to form four arms or fingers 147 which are of a size and are located such that they may slide through the four openings 59 of the bushing 51. The front edges 147A of the arms 147 taper toward the axis in a forward direction, as shown in FIGS. 3, 4, and 10. The sleeve 141 is fitted around the body member 23 from its rear end. The inside diameter of the opening 143 at the forward end of the sleeve 141 is large enough to fit around the enlarged forward portion 51AF of the bushing 51 whereby the arms 147 may be inserted through the openings 59 of the bushing 51. The sleeve 141 may be moved to a rearward unlatched position, as shown in FIG. 4, or to a forward latched position, as shown in FIG. 3. In the unlatched position, the tension of the spring 121 causes it to move radially inward whereby its inner surface engages the bushing surface 51AF such that its outer surface does not protrude radially outward beyond the maximum diameters of the shell 61 and the bushing 51, as shown in FIG. 3. In this position, the spring 121 is in an unlatched position. The outside diameter of bushing portion 51AF is slightly greater than the normal inside diameter of the spring 121 whereby it is tightly held by its tension within the slot 131 when the sleeve 141 is in its rearward unlatched position.

When sleeve 141 is moved to a forward latched position, the tapered edges 147A of the arms 147 move "under" the spring 121 causing it to ride "up" the tapered edges 147A and to seat on the outer surface of the forward portion 141A of the sleeve 141 at the four positions of the arms 147. This causes the spring 121 at the positions of the arms 147 to extend radially outward beyond the maximum diameters of the shell 61 and the bushing 51 whereby the spring 121 may latch the test probe to the inside wall of the opening of the aircraft structure. References are made to U.S. Pat. No. 3,505,635 for a disclosure of the wall of an opening to which the probe may be latched. FIG. 22 also shows a hollow metal housing breech 212 having an opening 213 into which the front portion of the test probe 21 may be inserted and the spring 121 latched into groove 215 for latching the probe 21 within the opening 213 of the housing breech 212. The forward edge of the contact 81 will engage the wall 217 of the housing breech and the contact 103 will engage a pin contact (not shown) of the equipment to be tested through opening 219 formed through the wall 217.

The rear portion 141B of the sleeve 141 is bifurcated forming two spaced apart end members 161 and 163 having space 143A therebetween. The opening 143 narrows to a smaller diameter rear opening 143B which has a diameter equal to the distance between the inside surfaces 161A and 163A of members 161 and 163. The rear inside surface 141C of the sleeve 141 slides on the rear portion 23B of the member 23 at the slots 27 and 29 as the sleeve is moved to its forward and rearward positions. The rear end of the sleeve 141 has one or more apertures 165 formed therein from the inside, each of which has a spring 167 and a ball 169 located therein. The springs 167 force the balls 169 inward into either of annular slots 27 or 29 when the sleeve 141 is moved to its rearward or forward positions. Thus, the balls 169 are releaseably held in either of slots 27 or 29 by the springs 167 for releaseably holding the sleeve 141 in either its rearward or forward positions. An aperture 171 is located opposite each of apertures 165 and are used to facilitate drilling apertures 165 after which the apertures 171 are closed by set screws 172. The rear slanted surface 175 of the shell 61 will engage the tapered edges 147A of the arms 147 if the sleeve 141 is moved further forward than that shown in FIG. 3 and limits the maximum forward position of the sleeve 141.

Located and secured within the space 143A between the end members 161 and 163 is an elongated block member 181. Member 181 has four sides 182–185 and two ends 186 and 187 with an opening 189 formed through the end 187 which extends toward end 186 along the length of member 181 until it intersects an opening 191 formed into side 183 transversely to the length of member 181. A threaded aperture 193 is formed into end 186 intersecting opening 191 and an opening 195 is formed into side 185 intersecting opening 191.

The rearmost portion 23E of the body member 23 (rearward of slots 27 and 29) has a small outside diameter which is adapted to fit in the opening 191 of the block member 181. In assembly, the block member 181 is located in the space 143A between members 161 and 163 with the end portion 23E of body member 23 located in the opening 191. The block member 181 is secured to the body member 23 by screwing a bolt 197 into threaded apertures 193 and 31 of members 181 and 23 and inserting a bolt 199 through aperture 195 of member 181 and screwing it into aperture 33 of member 23.

When the sleeve 141 is moved between its rearward and forward positions, members 161 and 163 slide or move past the sides 182 and 184 respectively of the block member 181. The block member 181 limits rearward movement of the sleeve 141.

The leads 89 and 99 are extended through rear opening 35 of member 23 into the opening 189 of member 181 and are connected to two terminals 201 and 203 supported by electrical insulating material 205 located in the opening 189 at the threaded end 187. Terminals 201 and 203 are connected to other terminals of the test equipment which is not shown.

The spring 121 provides an effective latching mechanism that is easy to install and replace if necessary. In addition, it allows a given test probe to be fitted into and latched in different diameter openings within certain limits whereby a different diameter test probe will not be needed for each housing breech of a different diameter. In the preferred embodiment, a spring of the type shown at 121 in FIG. 15 is employed in the slot 131 for latching purposes. In another embodiment, an elastic ring member of a suitable plastic, such as a teflon covered silicone "O" ring, as shown at 211 in FIGS. 36 and 37, may be employed in the slot 131 instead of the spring 121. The bifurcated sleeve 141 and the lead routing block 181 provides a compact arrangement for routing the leads 90° from the forward contacts. It is to be understood that the body member 23 and sleeve 141 can be made shorter or longer as desired.

The test probe of FIGS. 16–21 is similar to that of FIGS. 1–15, except the tubular body member 23 and the sleeve 141 of the embodiment of FIGS. 1–15 are different in the embodiment of FIGS. 16–21. In FIGS. 1–15 and 16–21, like reference numerals identify like components. In FIGS. 16–21, the tubular body member corresponding to the tubular body member 23 of FIGS. 1–15 is identified at 223. Member 223 is the same as member 23, except that the annular grooves or slots 27 and 29 are not present in the member 223.

In FIGS. 16–21, the sleeve corresponding to sleeve 141 of FIGS. 1–15 is identified at 241 and is formed by two sleeve components 243 and 245 connected together by a split metal spring ring 247. The sleeve component 243 has a forward portion 249 and a rear portion 251 with a central aperture 253 extending therethrough. The inside and outside surfaces of the forward portion 249 are cylindrical and the inside surface of the rear portion 251 is cylindrical having an inside diameter less than that of the forward portion 249. The rear portion 251 can freely slide around the tubular member 223. The front end of the forward portion 249 has four spaced apart slots 255 formed therein rearward of its forward edge 249FE forming four angularly spaced apart arms 257 which are of a size such that they can pass through the four openings 59 of the bushing 51 and slide on the outer surface 51AF of the bushing 51. A groove 261 is formed in the outside surface of each of the arms 257. The rear portion 251 has an outside diameter smaller than that of the forward portion 249 and tapers inward toward its rear end. An annular slot 263 is formed in the outer surface of the rear portion 251 for receiving a portion of the split ring 247.

The sleeve component 245 has a central opening 265 formed therethrough. It comprises a forward hollow cylindrical portion 267 having an inside diameter sufficient to fit around the rear portion 251 of component 243 and a rear hollow cylindrical portion 269 having an inside diameter sufficient to fit around and slide freely on the tubular body member 223. An annular slot 271 is formed in the inside wall of the cylindrical portion 267 and is capable of completely receiving the split ring 247 to allow the rear portion 251 of component 243 to be inserted within the central opening of the cylindrical portion 267 of component 245 until the slots 263 and 271 are aligned at which position the split ring 247 locates partially within both slots 263 and 271 to connect the sleeve components 243 and 245 together.

The rear portion of sleeve component 245 is bifurcated forming two spaced apart end members 281 and 283 having space 285 therebetween. The diameter of the opening 265A of rear cylindrical portion 269 is equal to the distance between the inside surfaced 281A and 283A of members 281 and 283. The block member 181 of the test probe is located in the space 285 between members 281 and 283 whereby the members 281 and 283 will slide or move relative to the sides of the block member 181 as the sleeve 243 is moved between its forward position as shown and FIG. 17 and its rearward position wherein the rear end 296A of rear cylindrical portion 269 of the sleeve component 245 abuts against the block member 181 which limits rearward movement of the sleeve 243.

When the sleeve 243 is in its rearward position relative to the tubular body member 223, the arms or cams 257 are moved rearward of the annular slot 131 and the spring member 121 seats on the annular bushing surface 51AF such that the outer surface of the spring 121 does not protrude radially outward beyond the maximum diameters of the shell 61 and the bushing 151. When the sleeve 243 is moved to its forward position relative to the tubular body member 223, the tapered forward edges 257A of the arms 257 move "under" the spring 121 causing it to ride "up" the tapered edges 257A and to seat in the grooves 261 of the arm members 257. This position of the spring 121 in the slot 131 and in the two grooves 261 of each of the arms 257 allows the spring 121 to releaseably hold the sleeve 243 in its forward latching position. In addition, the spring 121 at the apex 257B of each of the arms 257 between its two grooves 261 extends radially outward of the annular slot 131 beyond the maximum diameters of the shell 61 and the bushing 51 whereby the spring 121 may latch the test probe in the inside wall of the opening of the structure to be tested. This arrangement allows the sleeve 243 to be effectively held in its forward latching position without the need of the releaseable holding arrangement comprising the springs 167 and the balls 169 of the embodiment of FIGS. 1-15 which is more difficult to form and is not as effective as the spring 121 in combination with the grooves 261 for releaseably holding the sleeve 243 in its forward position. In order to move the sleeve to its rearward position, one merely needs to move the sleeve 243 rearward relative to the tubular body member 223 by engaging the outer portion of the sleeve 243 while the test probe is latched in the opening and moving the sleeve 243 rearward. The latching spring 121 has the same advantages as that of the embodiment of FIGS. 1-15 in that it will effectively latch the test probe in an opening and is easy to install and replace if necessary. In addition, the latching mechanism allows a given test probe to be fitted into and latched in different diameter openings within certain limits whereby a different diameter test probe will not be needed for each housing breech of a different diameter. In the preferred embodiment, the spring 121 is employed in the slot 131 for latching purposes and for releaseably holding the sleeve 243 in its forward position, however, the elastic ring member 211 of FIGS. 36 and 37 may be employed instead in the slot 131 for the same purposes.

The test probe of FIGS. 23-28 is similar to that of FIGS. 16-21 except that the bushing member and shell have been slightly modified; the block 181 removed; and the tubular body member and the rear component of the moveable sleeve have been modified to allow the insulating block 205 carrying the terminals 201 and 203 to which the leads 89 and 99 are connected to be located in the rear end of the tubular body member. In FIGS. 16-21 and 23-28, like reference numerals identify like components. In FIGS. 23-28, the bushing member, the shell, the tubular body member, and the sleeve corresponding to components 51, 61, 223, and 243 or FIGS. 16-21 are identified at 351, 361, 323, and 343 respectively.

Bushing 351 is the same as bushing 51 except that its front cylindrical wall 351A has the same outside diameter along its entire length and in addition, it has three outwardly extending studs 351B through which the apertures 57 extend.

The shell 361 is the same as shell 61 except that its outer surface is tapered at its front end and it has only one outside diameter at its rear portion.

The tubular body member 323 is similar to tubular body member 223 except for the following. Member 323 has an annular slot 325 formed in its rear portion for receiving a split ring 327 which acts as a rear stop for the sleeve 343. In addition, member 323 has no rear side opening for leads and the insulating member 205 for holding the terminals 201 and 203 is located in the rear portion of its central cavity 323C. Also the rear end of member 323 has an axial opening at 329 for leads to be connected to terminals 201 and 203 and its rear end is threaded at 331 to which a sleeve 333 is screwed for receiving a lead routing fitting of the type, for example, as disclosed in U.S. Pat. No. 4,602,123. The forward sleeve component 249 of sleeve 343 is the same as that of FIG. 17 in that it has arms 257 at its forward end with outer grooves 261 with the arms 257 being insertable through the openings 59 of the bushing 351 and their inner surfaces being slideable on the forward cylindrical portion 351A of the bushing 351 whereby they may be located between the cylindrical portion 351A and the spring 121 urging the spring outward in the slot 131 and into the outer grooves 261 of the arms for releaseably holding the sleeve 343 in its forward position and for holding the spring 121 outward of the slot 131 at the positions of the arms 257 for latching purposes. The sleeve 343 may be moved to its rearward position where it is stopped by the split ring 327. At this position, the arms 257 are moved from under the spring 121 to allow the spring to be released inward against the cylindrical surface 351A to an unlatched position where it does not protrude outward beyond the bushing 351 and the shell 361. The rear cylindrical component 345 is the same as the rear component 45 of FIG. 17 except that its rear end is cut short and it does not have the members 281 and 283 of the sleeve component 245 of FIG. 17.

In the preferred embodiment of FIGS. 23-28, the spring 121 is employed in the slot 131 for latching purposes, however, the elastic ring member 211 of FIGS. 36 and 37 may be employed instead in the slot 131 for latching purposes. An elastic "O" ring 291 also may be located around the rear of the sleeve component 249 to help stabilize the test probe in the opening in which it is to be latched.

Figure 30:
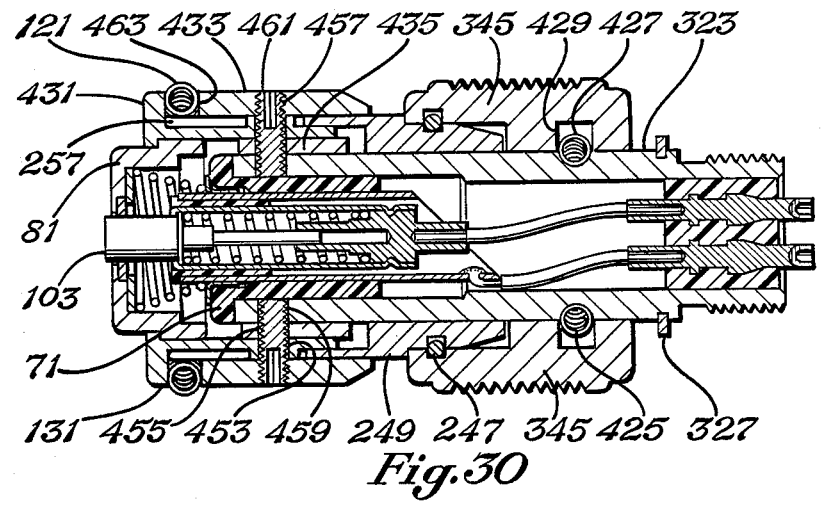
FIG. 30 is a cross-sectional side view of the test probe of FIG. 29 with its slideable sleeve in a forward position.
Figure 29:
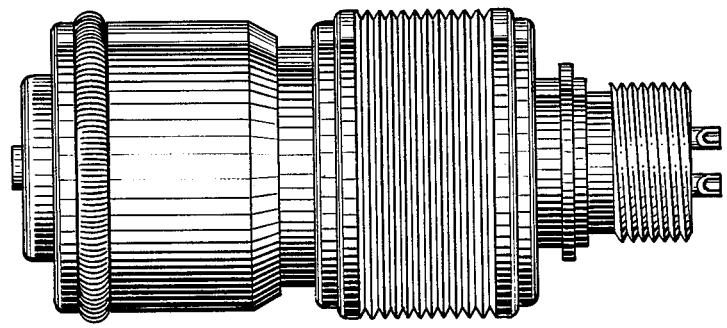
FIG. 29 is a side view of another embodiment of the test probe of the invention.
Figure 31:
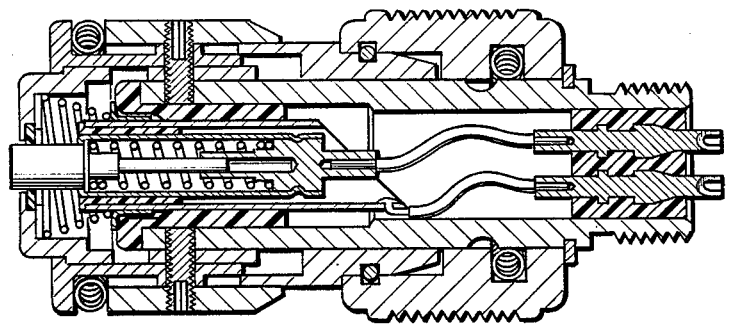
FIG. 31 is a cross-sectional view of the test probe of FIG. 29 with its slideable sleeve in a rearward position.

The test probe of FIGS. 29-35 is similar to that of FIGS. 23-28 except that a mount and a shell have been substituted for the shell and bushing respectively and a separate bushing is located between the mount and the tubular body member. In addition, the arms 257 of the sleeve component 249 have no outer grooves and a separate elastic ring member is employed to aid in releaseably holding the sleeve in its forward position. In FIGS. 23-28 abd 29-35, like reference numerals identify like components. Referring to FIGS. 29-35, the tubular body member 323 is similar to that of FIG. 24 except that it is shorter and it has an annular slot 425 formed in its rear portion for receiving a toroidal shaped spring 427 similar to that of spring 121 but of a smaller diameter. The sleeve 343 is the same as that of 343 of FIG. 24 and comprises the forward component 249 and the rear component 345 which are connected together by the split ring 247. The arms 257 are thinner in cross-section and do not have the tapered front edges or the outer grooves 261. The rear component 345 has an annular slot 429 formed in its inner wall which it has a size sufficient to completely receive the spring ring member 427. The slot 425 formed in the tubular body member 323 can only partially receive the spring ring member 427. When the sleeve 343 is moved to its rearward position, the split ring 327 limits its rearward position and the spring member 427 is rolled out of the slot 425 and is located in the slot 429 around the tubular member 343 rearward of the slot 425, as shown in FIG. 31. When the sleeve 343 is moved to its forward position, the spring 427 is rolled forward on the outer surface of the tubular body member 323 until both of the slots 425 and 429 are in alignment and the spring member 427 is located partially in both slots 425 and 429 to releaseably hold the sleeve member in its forward position.

The slot 131 for holding the latching spring 121 is located near the forward end of the test probe. When the sleeve 343 is moved to its forward position, the spring 121 acts to latch the test probe in the opening of a housing breech.

In the embodiment of FIGS. 29-35, the annular slot 131 is formed at its forward end by the mount member 431 and a shell 433. A bushing 435, which is a hollow cylindrical member fits around the forward portion of the tubular body member 323. The mount 431 is formed by a hollow cylindrical shaped portion 441 with a rim 443 formed at its forward end. The rim 443 has a portion 445 which extends radially inward of the cylindrical portion 441 for retaining or limiting forward movement of the contact member 81. The rim 443 has a radially outward extending portion 447 with a rearward facing surface 449 which acts as the forward portion of the slot 131. Four angularly spaced apart stud members 451 extend radially outward from the cylindrical portion 441 at the rear through which four clearance apertures 453 extend. The bushing 435 also has four angularly spaced apart clearance apertures 455 formed therethrough which are in alignment with the apertures 453 of the mount member 431. The shell 433 is a hollow cylindrical member which has four angularly spaced apart threaded apertures 457 formed therethrough. The front of the tubular body member 323 also has four angularly spaced apart clearance apertures 459 formed therethrough. When members 323, 435, 431, and 433 are fitted together, as shown in FIG. 30, the four sets of apertures 459, 455, 453, and 457 are in alignment and four set screws 461 are screwed through the apertures 457 such that they pass through apertures 453, 455, and 459 until they bear against the tubular insert 71 to secure the shell 433, the mount 431, the bushing 435 and the tubular insert 71 to the tubular body member 323, as shown in FIG. 30. In this position, the forward surface 463 of the shell 433 forms the rear edge of the slot 131 and the rear surface 449 of the rim portion 447 forms the forward edge of the slot 131. The inner surface of the slot 131 is formed by the outer surface of the forward portion 441A of the cylindrical portion 441 of the mount 431. The four studs 451 form apertures or openings 471 between adjacent studs and between the cylindrical wall 441 of the mount and the outer shell 433 (a portion of which is shown in FIG. 35) for receiving the arms 257 of the forward component 249 of the sleeve 343. In the forward position of the sleeve, the arms 257 slide on the cylindrical wall 441 of the mount 431 and urge the spring 121 radially outward at the position of the arms 257 whereby the spring 121, at the position of the arms 257, will be located radially outward of the outermost portion 447 of the rim 443 and radially outward of the shell 433 to latching positions.

In the preferred embodiment of FIGS. 29-35, the spring ring 121 is employed in the slot 131 for latching purposes and the spring ring 427 is employed in the slots 425 and 429 for releaseably holding the sleeve in its forward position, however, elastic ring members, similar to that shown at 211 in FIGS. 36 and 37, and of the appropriate diameters, may be employed instead in the slot 131 and in the slots 425 and 429 for the same purposes respectively.

Referring now to FIGS. 38 and 39, the test probe shown therein is similar to the test probe of FIGS. 29-35 except the front mount member and the forward component of the moveable sleeve have been modified and in addition the outer shell has been removed. In FIGS. 29-35, 38 and 39 like reference numerals identify like components. The front mount member 531 is formed by a hollow cylindrical shaped member 541 with a rim 543 formed at its forward end. The rim 543 has a portion 545 which extends radially inward from the cylindrical shaped portion 541 for retaining or limiting forward movement of the contact member 81. The rim 543 has a radially outward extending portion 547 with a rearward facing inclined surface 549 which acts as the forward portion of the annular slot 131. The cylindrical shaped portion 541 is adapted to be fitted around the bushing 435 and has four angularly spaced apart threaded apertures 553 formed therethrough for receiving four set screws 561. When members 323, 435, and 541 are fitted together as shown in FIG. 38, the three sets of apertures 459, 455, and 533 are in alignment respectively and the four set screws 561 are screwed through the apertures 553 such that they pass through apertures 455 and 459 until they bear against the tubular insert 71 to secure the mount 541, the bushing 435, and the tubular insert 71 to the tubular member 323, as shown in FIG. 38. When screwed in place, the set screws 561 do not extend outward beyond the outer surface of the cylindrical shaped member 541.

The sleeve component 649 has a rear portion 649A with a cylindrical inside wall 651 that is slideably located around the tubular body member 323 and an annular slot 653 formed in its outer wall for receiving the split ring 247 for connecting together the sleeve components 345 and 649 of the sleeve 343. The forward portion 649B of the sleeve component 649 has an inside cylindrical wall 655 that is slideably located around the cylindrical portion 541 of the mount 531. The forward edge 657 of the sleeve component is circular (it has no arms or fingers) 649 and forms the rear portion of the annular slot 131. The ring shaped member 121 is located in the slot 131. The sleeve 343 comprising the sleeve components 345 and 649 is adapted to move between a rearward position where it abuts against the ring stop 327 and a forward position, as shown in FIG. 38. In the rearward position of the sleeve 343, the spring ring 427 is located in the position as shown in FIG. 31 and the spring ring 121 is located in an unlatched position against the cylindrical portion 541 rearward of the inclined surface or ramp 541 such that it does not extend outward beyond the rim 547 and the outer surface of the sleeve portion 649B. When the sleeve 343 is moved to its forward position, the front edge 657 of sleeve component 649 engages the spring ring 121 and forces it forward and outward against the inclined surface 549 to a latching position where it extends outward beyond the rim 547 and the outer surface of the sleeve component 541, as shown in FIG. 38. In this position of the sleeve 343, the spring ring 427 is located partially in both annular slots 425 and 427 releaseably holding the sleeve 343 in its forward position. When the sleeve 343 is moved rearward, the spring ring 121 slides or rolls rearward and inward against the inclined surface 549 to the unlatching position, as shown in FIG. 39.

In the preferred embodiment of FIGS. 38 and 39, the spring ring 121 is employed in the slot 131 for latching purposes and the spring ring 427 is employed in the slots 425 and 429 for releaseably holding the sleeve 343 in its forward position, however, elastic ring members, similar to that shown at 211 in FIGS. 36 and 37 and of appropriate diameters, may be employed instead in the slot 131 and in the slots 425 and 429 for the same purposes respectively.

In the embodiments of FIGS. 29–35, 38, and 39, the use of the rear resilient or elastic ring shaped member (spring 427 or the member 211) in the slots 425 and 429 for releaseably holding the sleeve in its forward position has advantages over the balls 169 and springs 167 shown in FIG. 3 in that the elastic ring member is easier to install and remove and will not come out of the slots.

In the embodiments of FIGS. 16–21, 23–28, and 29–35, the elastic ring shaped member (spring 121 or member 211) in the slot 131 in combination with the stop (block 181 or split ring 327) also acts to releaseably hold the sleeve in its rearward position, since forward force must be applied to force the arms of the sleeve under the elastic ring member in the slot 131 to force the elastic ring member outward for latching purposes.

In the embodiments of FIGS. 29–35, 38, and 39, the rear elastic ring shaped member (spring 427 or member 211) also acts to releaseably hold the sleeve in its rearward position, since forward force must be applied to the sleeve relative to the tubular body member to roll the elastic ring member forward around the tubular body member 323.

If desired, in the embodiment of FIGS. 29–35, grooves can be formed in the outer surfaces of the arms 257 of the sleeve component 249 near their forward ends, as shown at 261 in FIG. 40, for receiving the elastic ring shaped member (spring 121 or member 211) in the slot 131 when the sleeve is in its forward position to perform the function of forcing portions of the ring shaped member outward of the slot 131 for latching purposes and also to aid the ring shaped member in the slots 425 and 429 in releaseably holding the sleeve in its forward position.

I claim:

1. A test probe apparatus, comprising:
   tubular body means having a front end and a rear end,
   structure including electrical contact means supported at said front end of said tubular body means,
   electrical leads connected to said electrical contact means and extending through said tubular body means towards said rear end,
   structure coupled to the front portion of said tubular body means forming an outer annular slot,
   said annular slot being defined by forward and rearward facing wall means and inner wall means facing outward,
   said forward and rearward facing wall means and said inner wall means being secured in place relative to said tubular body member,
   at least a portion of said forward facing wall means being spaced radially outward from said inner wall means defining opening means leading to said annular slot between said forward facing wall means and said inner wall means,
   a ring shaped member located in said annular slot,
   said ring shaped member being of the type that can be expanded outward from its axis and when released it will retract inwardly,
   an axially movable sleeve means located around said tubular body means,
   said sleeve means being adapted to be moved between rearward and forward positions relative to said tubular body means,
   at least the forward portion of said sleeve means being movable is said opening means,
   said sleeve means having front means adapted to be located between said inner wall means and at least portions of said ring shaped member when said sleeve means is moved toward said forward position for moving at least portions of said ring shaped member outward of said annular slot for use for latching said test probe apparatus to structure of an opening,
   in said rearward position of said sleeve means, said front means of said sleeve means is located rearward of said ring shaped member sufficient to allow it to be released inwardly in said annular slot to an unlatching position.

2. The test probe apparatus of claim 1, wherein said ring shaped member comprises a helically wound spring member having two ends connected together forming a toroidal shaped spring.

3. The test probe apparatus of claim 1, wherein said ring shaped member comprises a non-metallic elastic member.

4. The test probe apparatus of claim 1, wherein:
   said sleeve means has a central axis,
   said front means of said sleeve means comprises a plurality of angularly spaced apart arm means located around said central axis,
   each of said arm means having an outer surface defined by two outer side edges extending to an outer central portion,
   each of said arm means having grooves formed in its outer side edges on each side of its outer central portion with its outer central portion having no groove formed therein.

5. The test apparatus of claim 4, comprising
   groove means formed in the outer surface of said front means of said sleeve means,
   in said forward position of said sleeve means, said front means of said sleeve means is located between said inner wall means and said ring shaped member forcing at least portions of said ring shaped member outward into said grove means of said sleeve means for releasably holding said sleeve means in its forward position relative to said tubular body means and for use for latching said test probe apparatus to structure of an opening.

6. The test probe apparatus of claim 4, comprising:
   an annular rear slot formed in the outer wall of said tubular body means,
   an annular rear slot formed in the inner wall of said sleeve means,
   said annular rear slots being formed in said tubular body means and in said sleeve means such that they are in alignment with each other when said sleeve means is in its forward position relative to said tubular body means and out of alignment with each other when said sleeve means is in its rearward position relative to said tubular body means,
a second ring shaped member being of the type that can be expanded outward from its axis and when released it will retract inwardly,
said annular rear slot formed in the inner wall of said sleeve means having a size sufficient to completely receive said second ring shaped member,
said annular rear slot formed in the outer wall of said tubular body means having a size sufficient to only partially receive said-second ring shaped member,
said second ring shaped member being located around said tubular body means out of and rearward of said annular rear slot formed in said tubular body means and in said annular rear slot formed in said sleeve means when said sleeve means is in its rearward position relative to said tubular body means,
said second ring shaped member being located partially in both of said annular rear slots when said sleeve means is in its forward position relative to said tubular body means for releaseably holding said sleeve means in its forward position relative to said tubular body means.

7. A test probe apparatus, comprising:
tubular body means having a front end and a rear end,
structure including electrical contact means supported at said front end of said tubular body means,
electrical leads connected to said electrical contact means and extending through said tubular body means towards said rear end,
structure coupled to the front portion of said tubular body means forming at least a portion of an outer annular slot,
a ring shaped member located in said annular slot,
said ring shaped member being of the type that can be expanded outward form its axis and when released it will retract inwardly,
an axially movable sleeve means located around said tubular body means,
said sleeve means being adapted to be moved between rearward and forward positions relative to said tubular body means,
said sleeve means having front means adapted to engage at least portions of said ring shaped member when said sleeve means is moved toward said forward position for moving at least portions of said ring shaped member outward of said annular slot for use for latching said test probe apparatus to structure of an opening,
in said rearward position of said sleeve means, said front means of said sleeve means is located rearward of said ring shaped member sufficient to allow it to be released inwardly in said annular slot to an unlatching position.
an annular rear slot formed in the outer wall of said tubular body means,
an annular rear slot formed in the inner wall of said sleeve means,
said annular rear slots being formed in said tubular body means and in said sleeve means such that they are in alignment with each other when said sleeve means is in its forward position relative to said tubular body means and out of alignment with each other when said sleeve means is in its rearward position relative to said tubular body means,
a second ring shaped member being of the type that can be expanded outward form its axis and when released it will retract inwardly,
said annular rear slot formed in the inner wall of said sleeve means having a size sufficient to completely receive said second ring shaped member,
said annular rear slot formed in the outer wall of said tubular body means having a size sufficient to only partially receive said second ring shaped member,
said second ring shaped member being located around said tubular body means out of and rearward of said annular rear slot formed in said tubular body means and in said annular rear slot formed in said sleeve means when said sleeve means is in its rearward position relative to said tubular body means,
said second ring shaped member being located partially in both of said annular rear slots when said sleeve means is in its forward position relative to said tubular body means for releasably holding said sleeve means in its forward position relative to said tubular body means.

8. The test probe apparatus of claim 7, wherein said second ring shaped member comprises a helically wound spring member having two ends connected together forming a toroidal shaped spring.

9. The test probe apparatus of claim 7, wherein said second ring shaped member comprises a non-metallic elastic member.

10. A test probe apparatus, comprising:
tubular body means having a front end and a rear end,
structure including electrical contact means supported at said front end of said tubular body means,
electrical leads connected to said electrical contact means and extending through said tubular body means towards said rear end,
structure coupled to the front portion of said tubular body means forming a portion of an outer annular slot and comprising a surface which extends outward away from said front portion of said tubular body means,
a ring shaped member located in said annular slot,
said ring shaped member being of the type that can be expanded outward from its axis and when released it will retract inwardly,
an axially movable sleeve means located around said tubular body means,
said sleeve means being adapted to be moved between rearward and forward positions relative to said tubular body means,
said sleeve means having front means forming another portion of said annular slot adapted to engage and force said ring shaped member outward against said surface when said sleeve means is moved toward said forward position for moving said ring shaped member outward of said annular slot for use for latching said test probe apparatus to structure of an opening,
in said rearward position of said sleeve means, said front means of said sleeve means is located rearward of said ring shaped member sufficient to allow it to be released inwardly in said annular slot to an unlatching position,
an annular rear slot formed in the outer wall of said tubular body means,
an annular rear slot formed in the inner wall of said sleeve means, said annular rear slot being formed in said tubular body means and in said sleeve means such that they are in alignment with each other when said sleeve means is in its forward position relative to said tubular body means and out of alignment with each other when said sleeve means is in its rearward position relative to said tubular body means, a second ring shaped member being of the type that can be expanded outward from its axis and when released it will retract inwardly, said annular rear slot formed in the inner wall of said sleeve means having a size sufficient to completely receive said second ring shaped member, said annular rear slot formed in the outer wall of said tubular body means backing a size sufficient to only partially receive said second ring shaped member, said second ring shaped member being located around said tubular body means out of and rearward of said annular rear slot formed in said tubular body means and in said annular rear slot formed in said sleeve means when said sleeve means is in its rearward position relative to said tubular body means, said second ring shaped member being located partially in both of said annular rear slots when said sleeve means is in its forward position relative to said tubular body means for releaseably holding said sleeve means in its forward position relative to said tubular body means.

11. A test probe apparatus, comprising:

tubular body means having a front end and a rear end, structure including electrical contact means supported at said front end of said tubular body means, electrical leads connected to said electrical contact means and extending through said tubular body means towards said rear end, structure coupled to the front portion of said tubular body means forming an outer annular slot, said annular slot being defined by forward and rearward facing wall means and inner wall means facing outward, at least a portion of said forward facing wall means being spaced radially outward from said inner wall means defining opening means leading to said annular slot between said forward facing wall means and said inner wall means, a ring shaped member located in said annular slot, said ring shaped member being of the type that can be expanded outward from its axis and when released it will retract inwardly, an axially movable sleeve means located around said tubular body means, said sleeve means being adapted to be moved between rearward and forward positions relative to said tubular body means, at least the forward portion of said sleeve means being movable in said opening means, said sleeve means having front means with groove means formed in the outer surface thereof, in said forward position of said sleeve means, said front means of said sleeve means is located between said inner wall mans and said ring shaped member forcing at least portions of said ring shaped member outward into said groove means of said sleeve means for releasably holding said sleeve means in its forward position relative to said tubular body means and for use for latching said test probe apparatus to structure of an opening, in said rearward position of said sleeve means, said front means of said sleeve means is located rearward of said ring shaped member sufficient to allow it to be released inwardly in said annular slot to an unlatching position.

12. The test probe apparatus of claim 11 wherein said ring shaped member comprises a helically wound spring member having two ends connected together forming a toroidal shaped spring.

13. The test probe apparatus of claim 11 wherein said ring shaped member comprises a non-metallic, elastic member.

14. The test probe apparatus of claim 11, wherein:

said sleeve means has a rear end which is bifurcated forming two spaced apart end members, a block member having a first opening formed into its side and a second opening formed in its end with said first and second openings intersecting each other, said rear end of said tubular body means being located in said first opening and secured to said block member with said block member being located in the space between said two spaced apart end members of said sleeve means such that said two end members move forward and rearward relative to said block member on opposite sides thereof as said sleeve means is moved between its forward and rearward positions, said rear end of said tubular body means having an opening formed therethrough in communication with said second opening of said block member forming a passage for said leads out of said tubular body means.

15. The test probe apparatus of claim 11, comprising:

an annular rear slot formed in the outer wall of said tubular body means, an annular rear slot formed in the inner wall of said sleeve means, said annular rear slots being formed in said tubular body means and in said sleeve means such that they are in alignment with each other when said sleeve means is in its forward position relative to said tubular body means and out of alignment with each other when said sleeve means is in its rearward position relative to said tubular body means, a second ring shaped member being of the type that can be expanded outward from its axis and when released it will retract inwardly, said annular rear slot formed in the inner wall of said sleeve means having a size sufficient to completely receive said second ring shaped member, said annular rear slot formed in the outer wall of said tubular body means having a size sufficient to only partially receive said second ring shaped member, said second ring shaped member being located around said tubular body means out of and rearward of said annular rear slot formed in said tubular body means and in said annular rear slot formed in said sleeve means when said sleeve means is in its rearward position relative to said tubular body means, said second ring shaped member being located partially in both of said annular rear slots when said sleeve means is in its forward position relative to said tubular body means for releaseably holding said sleeve means in its forward position relative to said tubular body means.

16. The test probe apparatus of claim 15 wherein said second ring shaped member comprises a helically wound spring member having two ends connected together forming a toroidal shaped spring.

17. The test probe apparatus of claim 15 wherein said second ring shaped member comprises a non-metallic elastic member.

18. A test probe apparatus, comprising:
a tubular body member having a front end and a rear end,
structure including electrical contact means supported at said front end of said tubular body member,
electrical leads connected to said electrical contact means and extending through said tubular body member toward said rear end,
tubular means having a forward tubular portion secured around said front end of said tubular body member and a rear tubular portion spaced outward from said forward tubular portion with a plurality of angularly spaced apart outward extending wall means connecting said forward and rearward tubular portions, forming a plurality of angularly spaced apart apertures,
a forward member coupled to said front end of said tubular body member,
said forward member having a first portion for retaining an electrical contact of said electrical contact means and a second portion which extends to a position spaced forward of the forward edge of said rear tubular portion of said tubular means defining an annular slot surrounding a portion of said forward tubular portion of said tubular means,
a ring shaped member located in said annular slot,
said ring shaped member being of the type that can be expanded outward from its axis and when released it will retract inwardly,
an axially moveable sleeve member located around said tubular body member,
said sleeve member having a plurality of angularly spaced apart arm members at its forward end adapted to extend through said apertures of said tubular means,
said arm members having groove means formed in their outer surfaces,
said sleeve member being slideably supported for axial movement between forward and rearward positions relative to said tubular body member,
in said forward position of said sleeve member, said arm members are located between said forward tubular portion of said tubular means and said ring shaped member forcing portions of said ring shaped member into said groove means of said arm members and outward of said annular slot for releaseably holding said sleeve member in its forward position relative to said tubular body member and for use for latching said test probe apparatus to structure of an opening,
in said rearward position of said sleeve member, said arm members are located rearward of said ring shaped member sufficient to allow it to be released inwardly in said annular slot to an unlatching position.

19. The test probe apparatus of claim 18 wherein said ring shaped member comprises a helically wound spring member having two ends connected together forming a toroidal shaped spring.

20. The test probe apparatus of claim 18 wherein said ring shaped member comprises a non-metallic elastic member.

21. The test probe apparatus of claim 18, wherein:
said sleeve member has a rear end which is bifurcated forming two spaced apart end members,
a block member having a first opening formed into its side and a second opening formed in its end with said first and second openings intersecting each other,
said rear end of said tubular body member being located in said first opening and secured to said block member with said block member being located in the space between said two spaced apart end members of said sleeve member such that said two end members move forward and rearward relative to said block member on opposite sides thereof as said sleeve member is moved between its forward and rearward positions,
said rear end of said tubular body member having an opening formed therethrough in communication with said second opening of said block member forming a passage for said leads out of said tubular body member.

22. The test probe apparatus of claim 18, wherein:
said forward member is coupled to said front end of said tubular body member by way of said forward tubular portion of said tubular means.

23. The test probe apparatus of claim 18, comprising:
an annular rear slot formed in the outer wall of said tubular body member,
an annular rear slot formed in the inner wall of said sleeve member,
said annular rear slots being formed in said tubular body member and in said sleeve member such that they are in alignment with each other when said sleeve member is in its forward position relative to said tubular body member and out of alignment with each other when said sleeve member is in its rearward position relative to said tubular body member,
a second ring shaped member of the type that can be expanded outward from its axis and when released it will retract inwardly,
said annular rear slot formed in the inner wall of said sleeve member having a size sufficient to completely receive said second ring shaped member,
said annular rear slot formed in the outer wall of said tubular body member having a size sufficient to only partially receive said second ring shaped member,
said second ring shaped member being located around said tubular body member out of and rearward of said annular rear slot formed in said tubular body member and in said annular rear slot formed in said sleeve member when said sleeve member is in its rearward position relative to said tubular body member,
said second ring shaped member being located partially in both of said annular rear slots when said sleeve member is in its forward position relative to said tubular body member for releaseably holding said sleeve member in its forward position relative to said tubular body member.

24. The test probe apparatus of claim 23, wherein said second ring shaped member comprises a helically wound spring member having two ends connected together forming a toroidal shaped spring.

25. The test probe apparatus of claim 23, wherein said second ring shaped member comprises a non-metallic elastic member.

26. A test probe apparatus, comprising:
a tubular body member having a front end and a rear end,
structure including electrical contact means supported at said front end of said tubular body member,
electrical leads connected to said electrical contact means and extending through said tubular body member toward said rear end,
a bushing member having a forward cylindrical portion secured around said front end of said tubular body member and a rear cylindrical portion spaced radially outward from said forward cylindrical portion with a radially extending wall connecting said forward and rearward cylindrical portions,
a plurality of angularly spaced apart apertures formed through said radially extending wall,
a shell member secured around said front end of said tubular body member,
said shell member having a front portion for retaining an electrical contact of said electrical contact means and a rear portion which extends to a position spaced forward of the forward edge of said rear cylindrical portion of said bushing member defining an annular slot surrounding a portion of said forward cylindrical portion of said bushing member,
a ring shaped member located in said annular slot,
said ring shaped member being of the type that can be expanded outward from its axis and when released it will retract inwardly,
an axially moveable sleeve member located around said tubular body member,
said sleeve member having a plurality of angularly spaced apart arm members at its forward end adapted to extend through said apertures of said bushing member and being slideably supported for axial movement by said forward cylindrical portion of said bushing member,
said arm members having groove means formed in their outer surfaces,
said sleeve member having a rear portion slideably supported for axial movement by said tubular body member,
said sleeve member being slideably supported for axial movement between forward and rearward positions relative to said tubular body member,
in said forward position of said sleeve member, said arm members are located between said forward cylindrical portion of said bushing member and said ring shaped member forcing portions of said ring shaped member radially outward into said groove means of said arm members for releaseably holding said sleeve member in its forward position relative to said tubular body member and for use for latching said test probe apparatus to structure of an opening,
in said rearward position of said sleeve member, said arm members are located rearward from said ring shaped member sufficient to allow it to be released radially inward in said annular slot to an unlatching position.

27. The test probe apparatus of claim 26, wherein said ring shaped member comprises a helically wound spring member having two ends connected together forming a toroidal shaped spring.

28. The test probe apparatus of claim 26, wherein said ring shaped member comprises a non-metallic elastic member.

29. The test probe apparatus of claim 26, wherein:
said sleeve member has a rear end which is bifurcated forming two spaced apart end members,
a block member having a first opening formed into its side and a second opening formed in its end with said first and second opening intersecting each other,
said rear end of said tubular body member being located in said first opening and secured to said block member with said block member being located in the space between said two spaced apart end members of said sleeve member such that said two end members move forward and rearward relative to said block member on opposite sides thereof as said sleeve member is moved between its forward and rearward positions,
said rear end of said tubular body member having an opening formed therethrough in communication with said second opening of said block member forming a passage for said leads out of said tubular body member.

30. A test probe apparatus, comprising:
a tubular body member having a front end and a rear end,
structure including electrical contact means supported at said front end of said tubular body member,
electrical leads connected to said electrical contact means and extending through said tubular body member toward said rear end,
a cylindrical means having a forward cylindrical portion secured around said front end of said tubular body member and a rear cylindrical portion spaced radially outward from said forward cylindrical portion with a plurality of angularly spaced apart radially extending wall means connecting said forward and rearward cylindrical portions, forming a plurality of angularly spaced apart apertures between said forward and rear cylindrical portions,
a forward member coupled to the front end of said forward cylindrical portion,
said forward member having an inner portion for retaining an electrical contact of said electrical contact means and an outer portion which extends to a position spaced forward of the forward edge of said rear cylindrical portion of said cylindrical means defining an annular slot surrounding a portion of said forward cylindrical portion of said cylindrical means,
a ring shaped member located in said annular slot,
said ring shaped member being of the type that can be expanded outward from its axis and when released it will retract inwardly,
an axially moveable sleeve member located around said tubular body member,
said sleeve member having a plurality of angularly spaced apart arm members at its forward end adapted to extend through said apertures of said cylindrical means and being slideably supported for axial movement by said forward cylindrical portion of said cylindrical means, said sleeve member having a rear portion slideably supported for axial movement by said tubular body member, said sleeve member being slideably supported for axial movement between forward and rearward positions relative to said tubular body member, in said forward position of said sleeve member, said arm members are located between said forward cylindrical portion of said cylindrical means and said ring shaped member forcing portions of said ring shaped member radially outward for use for latching said test probe apparatus to structure of an opening, in said rearward position of said sleeve member, said arm members are, located rearward from said ring shaped member sufficient to allow it to be released radially inward in said slot to an unlatching position.

31. The test probe apparatus of claim 31, wherein said ring shaped member comprises a helically wound spring member having two ends connected together forming a toroidal shaped spring.

32. The test probe apparatus of claim 30, wherein said ring shaped member comprises a non-metallic elastic member.

33. The test probe apparatus of claim 30, comprising:
an annular rear slot formed in the outer wall of said tubular body member,
an annular rear slot formed in the inner wall of said sleeve member,
said annular rear slots being formed in said tubular body member and in said sleeve member such that they are in alignment with each other when said sleeve member is in its forward position relative to said tubular body member and out of alignment with each other when said sleeve member is in its rearward position relative to said tubular body member,
a second ring shaped member of the type that can be expanded outward from its axis and when released it will retract inwardly,
said annular rear slot formed in the inner wall of said sleeve member having a size sufficient to completely receive said second ring shaped member,
said annular rear slot formed in the outer wall of said tubular body member having a size sufficient to only partially receive said second ring shaped member,
said second ring shaped member being located around said tubular body out of and rearward of said annular rear slot formed in said tubular body member and in said annular rear slot formed in said sleeve member when said sleeve member is in its rearward position relative to said tubular body member,
said second ring shaped member being located partially in both of said annular rear slots when said sleeve member is in its forward position relative to said tubular body member for releaseably holding said sleeve member in its forward position relative to said tubular body.

34. The test probe apparatus of claim 33, wherein said second ring shaped member comprises a helically wound spring member having two ends connected together forming a toroidal shaped spring.

35. The test probe apparatus of claim 33, wherein said second ring shaped member comprises a non-metallic elastic member.

36. A test probe apparatus, comprising:
a tubular body member having a front end and a rear end,
structure including electrical contact means supported at said front end of said tubular body member,
electrical leads connected to said electrical contact means and extending through said tubular body member toward said rear end,
tubular means having a forward tubular portion secured around said front end of said tubular body member and a rear tubular portion spaced outward from said forward tubular portion with a plurality of angularly spaced apart outward extending wall means connecting said forward and rearward tubular portions, forming a plurality of angularly spaced apart apertures,
a forward member coupled to said front end of said tubular body member,
said forward member having a first portion for retaining an electrical contact of said electrical contact means and a second portion which extends to a position spaced forward of the forward edge of said rear tubular portion of said tubular means defining an annular slot surrounding a portion of said forward tubular portion of said tubular means,
a ring shaped member located in said annular slot,
said ring shaped member being of the type that can be expanded outward from its axis and when released it will retract inwardly,
an axially moveable sleeve member located around said tubular body member,
said sleeve member having a plurality of angularly spaced apart arm members at its forward end adapted to extend through said apertures of said tubular means,
said sleeve member being slideably supported for axial movement between forward and rearward positions relative to said tubular body member,
in said forward position of said sleeve member, said arm members are located between said forward tubular portion of said tubular means and said ring shaped member forcing portions of said ring shaped member outward of said annular slot for latching purposes,
in said rearward position of said sleeve member, said arm members are located rearward of said ring shaped member sufficient to allow it to be released inwardly in said annular slot to an unlatching position.

37. The test probe apparatus of claim 36, wherein said ring shaped member comprises a helically wound spring member having two ends connected together forming a toroidal shaped spring.

38. The test probe apparatus of claim 36, wherein said ring shaped member comprises a non-metallic elastic member.

39. The test probe apparatus of claim 36, wherein:
said sleeve member has a rear end which is bifurcated forming two spaced apart end members,
a block member having a first opening formed into its side and a second opening formed in its end with said first and second openings intersecting each other,
said rear end of said tubular body member being located in said first opening and secured to said block member with said block member being located in the space between said two spaced apart end members, said sleeve member such that said two end members move forward and rearward relative to said block member on opposite sides thereof as said sleeve member is moved between its forward and rearward positions, said rear end of said tubular body member having an opening formed therethrough in communication with said second opening of said block member forming a passage for said leads out of said tubular body member.

40. A test probe apparatus, comprising:

tubular body means having a front end and a rear end, structure including electrical contact means supported at said front end of said tubular body means, electrical leads connected to said electrical contact means and extending through said tubular body means towards said rear end, structure coupled to the front portion of said tubular body means forming a portion of an outer annular slot and comprising a surface which extends outward away from said front portion of said tubular body means, a ring shaped member located in said annular slot, said ring shaped member being of the type that can be expanded outward from its axis and when released it will retract inwardly and comprising a helically wound metallic spring member having two ends connected together forming a toroidal shaped spring member, an axially movable sleeve means located around said tubular body means, said sleeve means being adapted to be moved between rearward and forward positions relative to said tubular body means, said sleeve means having front means forming another portion of said annular slot adapted to engage and force said toroidal shaped spring member to move forward and to expand outward against said surface when said sleeve means is moved toward said forward position for moving said toroidal shaped spring member outward of said annular slot for use for latching said test probe apparatus to structure of an opening, said surface being shaped to allow said toroidal shaped spring member to move forward and to expand outward against said surface upon engagement by said front means of said sleeve means and when said sleeve means is moved toward said forward position, in said rearward position of said sleeve means, said front means of said sleeve means is located rearward of said toroidal shaped spring member sufficient to allow it to be released inwardly in said annular slot to an unlatching position.

41. The test probe apparatus of claim 40 wherein said surface comprises a frustum of a cone which extends outward away from said front portion of said tubular body means.

42. The test probe of claim 10, wherein said ring shaped member comprises a helically wound metal spring member having two ends connected together forming a toroidal shaped spring member, said surface being shaped to allow said toroidal shaped spring member to move forward and to expand outward against said surface upon engagement by said front means of said sleeve means and when said sleeve means is moved toward said forward position.

43. The test probe apparatus of claim 42 wherein said surface comprises a frustum of a cone which extends outward away from said front portion of said tubular body means.

* * * * *